United States Patent [19]

Sawada et al.

[11] Patent Number: 5,450,354
[45] Date of Patent: Sep. 12, 1995

[54] NON-VOLATILE SEMICONDUCTOR MEMORY DEVICE DETACHABLE DETERIORATION OF MEMORY CELLS

[75] Inventors: Kikuzo Sawada; Yoshikazu Sugawara, both of Tokyo, Japan

[73] Assignee: Nippon Steel Corporation, Tokyo, Japan

[21] Appl. No.: 232,996

[22] Filed: Apr. 25, 1994

Related U.S. Application Data

[63] Continuation-in-part of Ser. No. 216,874, Mar. 23, 1994, which is a continuation-in-part of Ser. No. 112,997, Aug. 30, 1993.

[30] Foreign Application Priority Data

| Aug. 31, 1992 | [JP] | Japan | 4-255608 |
| Aug. 31, 1992 | [JP] | Japan | 4-255609 |
| Aug. 31, 1992 | [JP] | Japan | 4-255610 |
| Mar. 25, 1993 | [JP] | Japan | 5-092571 |
| Apr. 26, 1993 | [JP] | Japan | 5-122015 |

[51] Int. Cl.⁶ .............................. G11C 17/18
[52] U.S. Cl. .................... 365/185; 365/184; 365/207; 365/208; 365/189.01
[58] Field of Search ............ 365/168, 185, 184, 200, 365/218, 207, 208, 189.01

[56] References Cited

U.S. PATENT DOCUMENTS

| 4,901,320 | 2/1990 | Sawada et al. | 371/51.1 |
| 4,964,079 | 10/1990 | Devin | 365/184 |
| 5,012,448 | 4/1991 | Matsuoka et al. | 365/184 |
| 5,043,940 | 8/1991 | Harari | 365/168 |
| 5,297,088 | 3/1994 | Yamaguchi | 365/200 |

FOREIGN PATENT DOCUMENTS 1-133300 3/1990 Japan.
3-288400 2/1991 Japan.

OTHER PUBLICATIONS

A 16Kb Electrically Erasable Nonvolatile Memory, Johnson, 1980 IEEE ISSCC Dig. Tech. Paper pp. 152–153, 271; 1980.

Analysis and Modeling of Floating-Gate EEPROM Cells, Kolodny et al., IEEE Trans. Electron Devices, Jun. 1986, ED-33, No. 6, pp. 835–844.

Semiconductor MOS Memory and Method of Using the Same, Nikkan Kogyo Newpapers Co., 1990, pp. 96–101.

A Novel Cell Structure Suitable For A 3 Volt Operation, Sector Erase Flash Memory, Onoda et al., IEDM 92, pp. 599–602, 1992.

*Primary Examiner*—David C. Nelms
*Assistant Examiner*—Vu A. Lê
*Attorney, Agent, or Firm*—Pollock, Vande Sande & Priddy

[57] ABSTRACT

A non-volatile semiconductor memory device capable of electrical programming including a plurality of memory cells, means for selecting at least one memory cell from the plurality of memory cells, mode setting means for setting one of a first read mode in which data written in the selected memory cell is read and a second read mode for detecting a change of the threshold voltage level of the selected memory cell, first comparing means for comparing a voltage signal read from the selected memory cell with at least a predetermined single first reference voltage level when the first read mode is set, first output means for producing a signal indicative of data written in the selected memory cell on the basis of the comparison in the first comparing means, second comparing means for comparing the cell voltage signal with at least a predetermined single second reference voltage level different from the first reference voltage level when the second read mode is set, and second output means for producing a signal indicative of a change of the threshold voltage of the selected memory cell on the basis of the comparison in the second comparing means.

8 Claims, 7 Drawing Sheets

O: THRESHOLD VOLTAGE IN THE PROGRAM MODE

O : THRESHOLD VOLTAGE IN THE PROGRAM MODE

⤴⤴ : DIRECTION OF THRESHOLD VOLTAGE CHANGE

NON-VOLATILE SEMICONDUCTOR MEMORY DEVICE DETACHABLE DETERIORATION OF MEMORY CELLS

CROSS-REFERENCE TO RELATED APPLICATIONS

This application is a continuation-in-part of U.S. patent application Ser. No. 08/216,874 filed on Mar. 23, 1994, which is a continuation-in-part of U.S. patent application Ser. No. 08/112,997 filed on Aug. 30, 1993. The contents of U.S. patent application Ser. No. 08/216,874 filed on Mar. 23, 1994 are incorporated herein by reference.

BACKGROUND OF THE INVENTION

1. Field of the Invention

This invention relates to non-volatile semiconductor memory devices and particularly to a non-volatile semiconductor memory device having means for detecting individually deterioration of the threshold voltage of a plurality of memory cells constituting the non-volatile semiconductor memory device.

2. Description of the Related Art

The prior art Documents related to the present invention are listed below.

Document 1: "A 16 Kb Electrically Erasable Non-volatile Memory", 1980 IEEE ISSCC Dig. Tech. Pap. pp. 152–153, 271, 1980.

Document 2: "Analysis and Modeling of Floating-Gate EEPROM Cells" IEEE Trans. Electron Devices June 1986, ED-33, No.6, pp. 835–844.

Document 3: "Semiconductor MOS Memory and Method of Using the Same", Nikkan Kogyo Newspaper Co., 1990, pp. 96–101.

Document 4: "A Novel Cell Structure Suitable For A 3 Volt Operation, Sector Erase Flash Memory" IEDM 92, pp. 599–602 (1992).

Document 5: "Flash EEPROM Memory Systems Having Multistate Storage Cells" U.S. Pat. No. 5,043,940 (1991).

Document 6: "Semiconductor Memory Device with Self-Correcting Function and Microcomputer" Patent Laid-open Gazette No. 1-133300(1989) corresponding to U.S. Pat. No. 4,901,320.

A non-volatile semiconductor memory device (hereinafter, referred to as PROM) of which the recorded data is not lost even if the power supply is turned off has already been developed and practically used since the early 1970's. In addition, another non-volatile semiconductor memory device (hereinafter, referred to as EEPROM) which is electrically erasable, as described in the Document 1, has been practically used since the 1980's.

In the write operation of a memory cell of the EEPROM, the transistor-structure memory cell having a floating gate is charged and discharged with electrons through a thin insulating oxide film by the Fowler-Nordheim tunneling effect, so that the threshold voltage of the transistor is controlled (see Documents 1 and 2). The threshold of the memory cell is increased by injecting electrons into the floating gate and decreased by discharging electrons or injecting holes.

For example, FIG. 2 in Document 3 shows the functional circuit blocks of this EEPROM. FIG. 7 in this document is a circuit block diagram of the conventional EEPROM which is given for the comparison with this invention.

In FIG. 7 there are shown 32 memory cells in four rows and eight columns in which two bits of data are simultaneously read and programmed. In order to selectively make programming, erasing and reading for the 32 memory cells, it is necessary to provide, as illustrated, decoder circuits, multiplexers, address buffers, a chip control circuit, a high-voltage generation/control circuit, programming circuits, a sense circuits, data input buffers and data output buffers.

In FIG. 7 there are also shown address input terminals 501, 502, 503 and 504 which are used for inputting the address data for the memory cells selected by row lines and column lines. Input terminals 505, 506 and 507 are used for inputting control signals for controlling the operation mode of the EEPROM; that is, the input terminal 505 is used for inputting a chip selection signal, the input terminal 506 for inputting an output selection signal, and the input terminal 507 for inputting a write signal. There are shown input/output terminals 508 and 509 from which the stored data of the selected memory cells are produced in the read mode and to which the data to be stored in the memory cells are supplied in the write mode. Address buffers 511, 512, 513 and 514 have the function to buffer and output the address data and to receive the power-down signal and reduce the current consumption in the input portion. In another conventional technique (as disclosed in Document 3), the address buffers are additionally provided with the function of latching the address data in response to a latch signal in the write mode.

A chip control circuit 515 is responsive to the control signals at the control input terminals 505, 506 and 507 to select the read mode, write mode, power-down mode (or standby mode) and output nonselection mode. The write mode is further divided into two modes, or the erase mode and the program mode. In the erase mode, the memory cells of a byte or a row or a memory block, to which the selected memory cell belongs, are made to the erased state in order to alter the data stored in the selected memory cell. The erased state of the memory cell means that the threshold of the memory cell is higher (or lower) than the gate voltage applied thereto in the read mode. In the program mode, the selected memory cell is made to the programmed state in accordance with the input data. The programmed state means that the threshold of the memory cell is lower (or higher) than the gate voltage applied thereto in the read mode. When the memory cell data is altered, the memory cell is first brought to the erase state in the erase mode and then brought to the programmed state in accordance with the input data. In other words, the write mode includes the erase mode and the program mode. The chip control circuit 515 also includes a function of terminating the erase mode or the program mode automatically in accordance with the internal timer.

A high-voltage generation/control circuit 518 has a circuit for increasing the power supply voltage supplied to the EEPROM in the write mode to generate a high voltage of about 10 through 25 V (referred to as charge pump circuit), and a control circuit for supplying desired high voltages to the circuits of the EEPROM in accordance with the erase mode and program mode.

A row decoder 516 decodes the outputs from the address buffers 511 and 512 and applies a high (H) voltage only to the row line (the word line) of the selected memory cell and a low (L) voltage to the row lines of the non-selected cells. The high voltage for selection is about the power supply voltage in the read mode and a high voltage in the write mode.

A column decoder 517 decodes the outputs from the address buffers 513, 514 and supplies a high voltage to the column line of a selected memory cell and a low voltage to the column lines of the non-selected memory cells through a multiplexer 527 or 528. The multiplexer 527 or 528 connects the selected column line (bit line) to be data line 597 or 598 in accordance with the signals from the column decoder 517. The output voltage from the column decoder 517 is about the power supply voltage in the read mode and a high voltage in the write mode.

There are shown row lines 529, 530, 531 and 532, and column lines 533, 534, 535, 536, 537, 538, 539 and 540. There are also shown memory sense program lines 577, 578, 579 and 580, and memory cells 545, 546, . . . , 576. Each memory cell includes one select transistor and one memory transistor and has the same structure and connection as shown in FIGS. 2 and 3 of Document 1. For example, the row line is connected to the gate of the select transistor, the column line to the drain of the select transistor, the memory sense program line to the gate of the memory transistor and a source line 604 to the source of the memory transistor.

In the write mode, a data input buffer 520 or 524 buffers the input data from the input/output terminal 508 or 509 and supplies it to a program circuit 519 or 523. The data input buffer may function to latch the input data in the write mode, in response to a latch signal.

The program circuit 519 or 523 receives a signal of program mode and a high voltage and supplies a high voltage or low voltage depending on the input data to the data line 597, 598. In this case, the conventional EEPROM can produce only one high voltage and one low voltage (normally 0 V).

A sense circuit 521, 525 detects and amplifies the voltage value or current value on the data line 597, 598 to which the data of the selected memory cell is transmitted through a column line and a multiplexer in the read mode. Then, the amplified voltage or current is outputted to a data output buffer.

A data output buffer 522, 526 receives the data from the sense circuit and supplies it to the output terminal in the read mode. Also it functions to inhibit the output in the power-down mode and the output non-selection mode.

In FIG. 7, reference numeral 581 is the output from the address buffer 511 and the input to the row decoder 516, 582 is the output from the address buffer 512 and the input to the row decoder 516, and 583 is the output from the address buffer 513 and the input to the column decoder 517. Shown at 584 is the output from the address buffer 514 and the input to the column decoder 517 and 585 through 588 are the outputs from the column decoder 517 and the inputs to the multiplexers 527 and 528. Shown at 603 is the power down signal from the chip control circuit 515. This signal is supplied to the control input terminals of the address buffers 511, 512, 513, 514. Shown at 589 is a read enable signal for activating or inactivating the sense circuits 521, 525. Shown at 590 is the program signal which, in the program mode, activates the program circuits 519, 523 and causes the high-voltage generation/control circuit 518 to generate high voltages on high voltage lines 594 and 596 and 0 V on a memory sense line 595. Shown at 591 is the erase signal for causing the high-voltage generation/control circuit 518 to generate high voltages at the outputs 594 and 595. Reference numeral 592 denotes a data input enable signal for activating the data input buffers 520, 524 in the write mode, and 593 a data output enable signal for activating the data output buffers 522, 526 in the read mode.

A first high voltage signal 594 of a high voltage is supplied to the row decoder 516 and the column decoder 517 in the write mode. A memory sense line 595 is at 0 V in the program mode, at a high voltage in the erase mode and at a voltage between 0 V and the power supply voltage in the reading mode. A second high voltage signal line 596 is at a high voltage in the program mode. An output 599 from the data input buffer 520 is fed to the input of the program circuit 519. An output 601 from the data input buffer 524 is fed to the input of the program circuit 523. An output 600 from the sense circuit 521 is fed to the input of the data output buffer 522. An output 602 from the sense circuit 525 is fed to the input of the data output buffer 526. Circuits 541, 542, 543 and 544 decode the signal 595 according to the signals on the row lines 529, 530, 531 and 532 into memory sense program signals 577, 578, 579 and 580.

The write operation and read operation of the conventional EEPROM will be described briefly.

In the read operation, the control signals from the control input terminals 505, 506 and 507 are rendered to the read mode and the selected address data are applied to the address input terminals 501, 502, 503 and 504. The input address data are held by the address buffers 511, 512, 513 and 514, and decoded by the row decoder 516 and column decoder 517. A selected one of the four output signal lines of the row decoder 516 which are respectively connected to the row lines is at a high voltage (normally about the power supply voltage), and the other three signal lines are at a low voltage. In addition, one column line is selected from the column lines 533 through 536 by the outputs 585 through 588 of the column decoder 517 through the multiplexer 527. Only the selected column line is electrically connected to the data line 597 through a low impedance. Similarly, one of the column lines 537 through 540 is selected by the outputs 595 through 588 through the multiplexer 528. At this time, a voltage of, for example, 2 through 4 V for detecting the threshold value of the memory cell is outputted to the memory sense line 595, and fed through the circuits 541 through 544 to only the selected one of the memory sense program lines. The memory ground line 604 is in the grounded state. The voltage from the sense circuit 521, 525 is supplied to the column line of the selected memory cell. When the threshold voltage of the memory cell is lower than the threshold detection voltage, the memory cell transistor is turned on and thus a current flows from the column line to the memory ground line 604. When the threshold voltage of the memory cell is higher than the threshold detection voltage, the selected memory cell transistor is turned off and thus no current flows from the column line to the memory ground line 604. The voltage on the column line is set by the sense circuit and the current to the column line in the read mode is supplied from the sense circuit. When this current is detected and amplified by the sense circuit, the stored data in the memory cell is produced on the line 600, 602 in a binary value of high or low voltage and fed through the data output buffer 522, 526 to the outside. If the threshold value of the memory cell is as high as 6 V, a high voltage is produced at the input/output terminal 508. If the threshold value of the memory cell is as low as 0 V, a low voltage is produced at the input/output terminal 508.

In the write operation, the data in the memory cell is erased first. In this prior art, the data erasing is normally made with a unit of one row line, but may be made with a unit of one byte or block. Although the erase mode in the prior art is effected by the control input to the input terminals 505, 506, 507, it is also possible to effect the erase mode by the input data to the data input buffer in addition to the control inputs. In the erase mode, the row line of the memory cell is selected by the address data from the address input terminals 501, 502. The line 594 is kept at a high voltage and the row line of the selected memory cell is at a high voltage, and 0 V is fed to the row lines of the other memory cells. In addition, the line 595 is at a high voltage and the memory sense program line of the row line of the selected memory cell is at a high voltage by the circuits 541 through 544. The sense circuits and program circuits 519, 521, 523 and 525 are inactivated in the erasing mode, and the line 597 is at 0 V or in the floating state. The memory ground line 604 is grounded in the erasing mode. Thus, a high voltage (for example, 20 V) is applied to the gate of the memory cell of the selected row line, and the drain and source are grounded. At this time, the Fowler-Nordheim tunnelling effect occurs causing injection of electrons from the drain into the floating gate so that the threshold value of the memory cell transistor becomes high (for example, 5 through 8 V).

When the erased memory cell is programmed, the program mode is inputted and the address data for program is supplied to the address input terminals 501, 502, 503, 504. In the program mode, the line 594 is at a high voltage, the line 595 is at 0 V, the line 596 is at a high voltage and the line 604 is in the floating state. The row decoder 516, the column decoder 517, the program circuit 519, 523 and the data input buffer 520, 524 are activated and the sense circuits 521, 525 and the data output buffers 522 and 526 are inactivated. If a low voltage is supplied as input data to the input terminal 508, the program circuit 519 produces a high voltage (for example, 20 V) on the output line 597, and if a high voltage is supplied to the input terminal 508, it produces 0 V on the line 597. When the line 597 is at a high voltage, the selected column line is at a high voltage (for example, 20 V) since the selected one of the outputs 585 through 588 from the column decoder is also at a high voltage. The selected row line is also at a high voltage and the memory sense program lines are at 0 V. Thus, the gate of the memory cell transistor is at 0 V and the drain is at a high voltage (for example, 20 V). At this time, the Fowler-Nordheim tunnelling effect causes discharge of electrons from the floating gate to the drain and injection of holes from the drain into the floating gate so that the threshold voltage of the memory cell transistor is reduced to, for example, −3 V to 0 V.

The Fowler-Nordheim tunnel current for storage principle in the conventional EEPROM is proportional to the electric field applied across the insulating film as expressed by the equation (1) of Document 2. The threshold value of the memory cell transistor is changed linearly with the high voltage in the erase or program mode as shown in, for example, in FIGS. 6 and 9 of Document 2. In the conventional EEPROM, only one high voltage value is used in the erase mode or the program mode. Even in the read mode, only a binary value of high or low can be detected.

Moreover, Document 6 discloses a circuit for and a method of detecting variation of the threshold voltage upon programming and erasing of a binary level. However, in this circuit and method, another memory cell for parity information different from those for program data is required in order to detect and correct variation of the data. A variation detection method in programming of a memory cell with four or more values has not been disclosed yet.

In the parent application, that is U.S. patent application Ser. No. 08/216,874 filed on Mar. 23, 1994, entitled "Non-volatile Semiconductor Device and a Method of Using the Same", at least three different data can be written in or read from each memory cell. In the parent application, one of a plurality of bits representing data of, for example, one byte which are written in a plurality of memory cells is used as a parity bit in order to check an error in writing or reading the data in or from the plurality of memory cells. This application is a continuation-in-part of the parent application and the contents of the parent application are incorporated herein by reference. It should be noted, however, that the terms "column" and "row" are used in this application in place of "row" and "column", respectively, used in the parent application.

In the conventional EEPROM and flash memory, when the number of altering repetitions is increased, the gate insulating film is deteriorated to reduce the amount of electricity stored in the memory cell with the result that the threshold voltage is decreased with time. When this threshold voltage is reduced to less than the level for judging "0" or "1" in the binary memory, the written data cannot be correctly read. In U.S. Pat. No. 4,901,320, a parity bit is provided to each word for correcting data error, but it does not concerned particularly with the reduction of the threshold voltage in the individual bit of each word. Therefore, even though the memory cell providing a bit of the word has its threshold voltage so reduced that it already becomes inappropriate for writing, that cell is still used, thus lowering the reliability of the whole system. Moreover, JP-A-3-288400 describes the technique for preventing the effect of the threshold voltage reduction of a reference cell with time, but it does not consider particularly the reduction of the threshold voltage in the individual bit of the word.

This problem is particularly serious in a non-volatile semiconductor memory device constructed to store at least three different data in one memory cell as disclosed in, for example, the parent application, because at least three different threshold values of the memory cell corresponding to different data are close to each other.

SUMMARY OF THE INVENTION

It is an object of the present invention to provide a non-volatile semiconductor memory device capable of predicting the threshold voltage reduction with time passage in each of a plurality of memory cells constituting the non-volatile semiconductor memory device before the threshold voltage is reduced to less than the level at which the memory cell can be read.

It is another object of the invention to provide a non-volatile semiconductor memory device capable of predicting the threshold voltage reduction with time passage in each of a plurality of memory cells constituting the non-volatile semiconductor memory device before the threshold voltage is reduced to less than the limit level that is necessary for the memory cell to maintain its written data for a predetermined period of time, and replacing at least that memory cell by a spare memory cell.

It is still another object of the invention to provide a non-volatile semiconductor memory device capable of increasing the number of repetitions of altering for the whole device.

It is further object of the invention to provide a non-volatile semiconductor memory device capable of storing at least three different data in each of a plurality of memory cells constituting the non-volatile semiconductor memory device and capable of increasing the number of repetitions of altering for the whole device.

An electrically programmable non-volatile semiconductor memory device according to this invention comprises a plurality of memory cells; means for selecting at least one of the plurality of memory cells; mode setting means for setting one of a first read mode in which the data written in the selected memory cell is read out and a second read mode in which a change of the threshold voltage level of the selected memory cell is detected; first comparing means for comparing a cell voltage signal read from the selected memory cell with at least one predetermined first reference voltage level when the first read mode is set; first output means for producing a signal indicating data written in the selected memory cell on the basis of the comparison by the first comparing means; second comparing means for comparing the cell voltage signal with at least one predetermined second reference voltage level different from the first reference voltage level when the second read mode is set; and second output means for producing a signal indicative of a change of the threshold voltage of the selected memory cell on the basis of the comparison by the second comparing means.

In a preferred embodiment of the invention, a relief memory cell group including relief memory cells is provided and the selected memory cell is replaced by one of the relief memory cells selected in accordance with the signal produced by the second output means.

In the application of this invention to, for example, a non-volatile semiconductor memory device which is constructed to store four different data in each memory cell, the program voltage values are set for input data "01", "00", "10", "11" and the threshold value of the memory cell is changed in proportion to the program voltage value. For example, if the program voltage is selected to be 22 V for input of "01", 20 V for "00", 18 V for "10" and 16 V for "11", the threshold value can be set to be $-3$ V for a program voltage of 22 V, 0 V for 20 V, 3 V for 18 V and 6 V for 16 V since the program voltage and the threshold of the memory cell have a proportional relation. Information of whether the threshold voltage value of the selected memory cell has been changed in the read mode from that in the program mode can be obtained as follows. To restore, for example, data of two bits, nine reference memory cells in which threshold values are stored are provided and the threshold voltage values of the reference memory cells are set to be, for example, 5.5 V, 4.5 V, 3.5 V, 2.5 V, 1.5 V, 0.5 V, $-0.5$ V, $-1.5$ V, $-2.5$ V. Then, the threshold value of the memory cell is compared with those reference cell threshold values in the sense circuit so that the data of two bits inputted in the program mode can be read. If necessary, the information of whether the threshold voltage value of the memory cell is increased or decreased as compared with that in the program mode can be read in at least two bits (at least one bit for detecting the presence or absence of a threshold change and at least one bit for detecting the increase of the threshold).

Thus the capacity of the non-volatile semiconductor memory device can be increased and the recorded data can be improved in its reliability.

DESCRIPTION OF THE PREFERRED EMBODIMENTS

Figure 1:
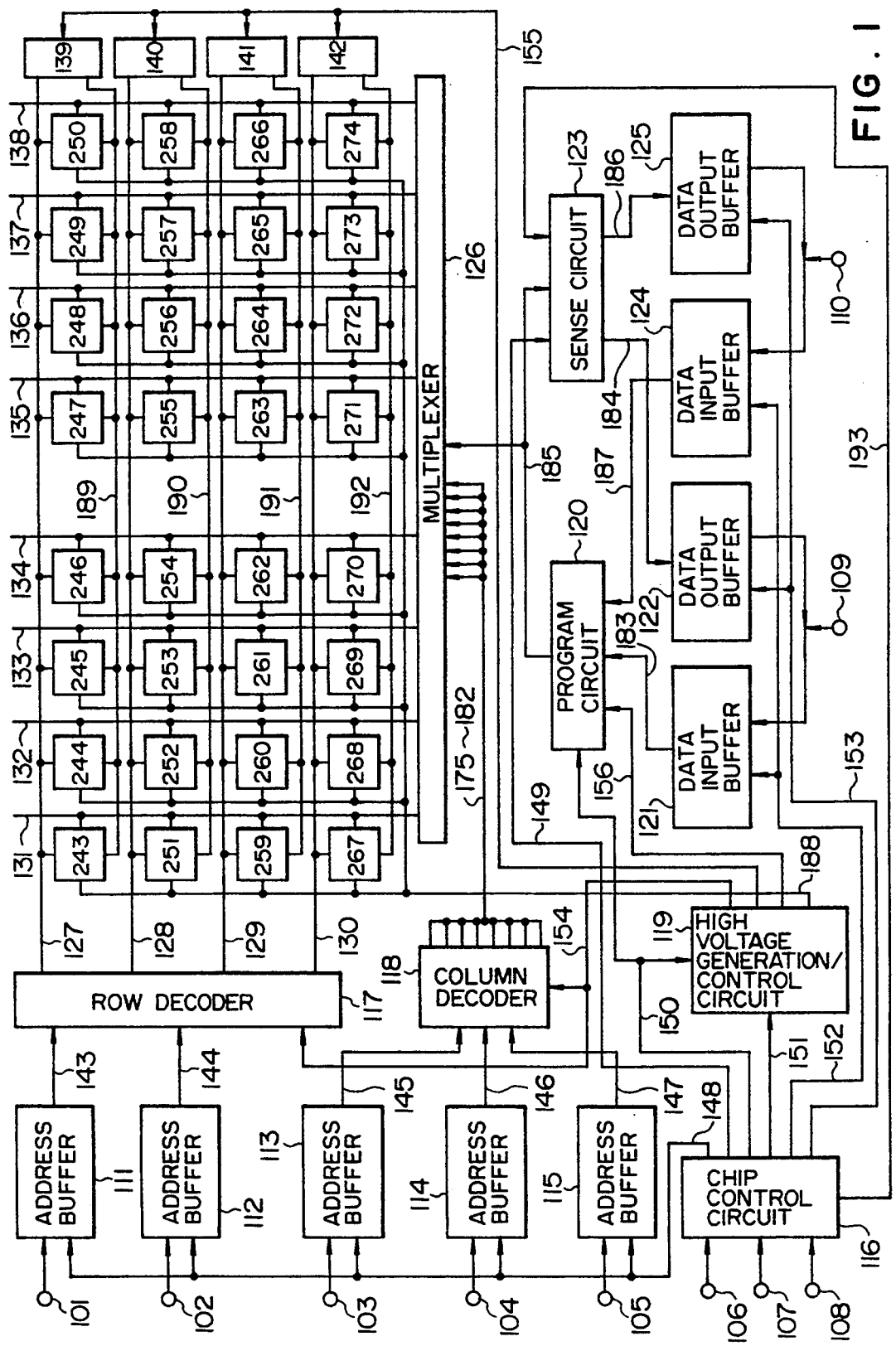
FIG. 1 is a circuit block diagram of one embodiment of an EPROM of the invention.
Figure 2:
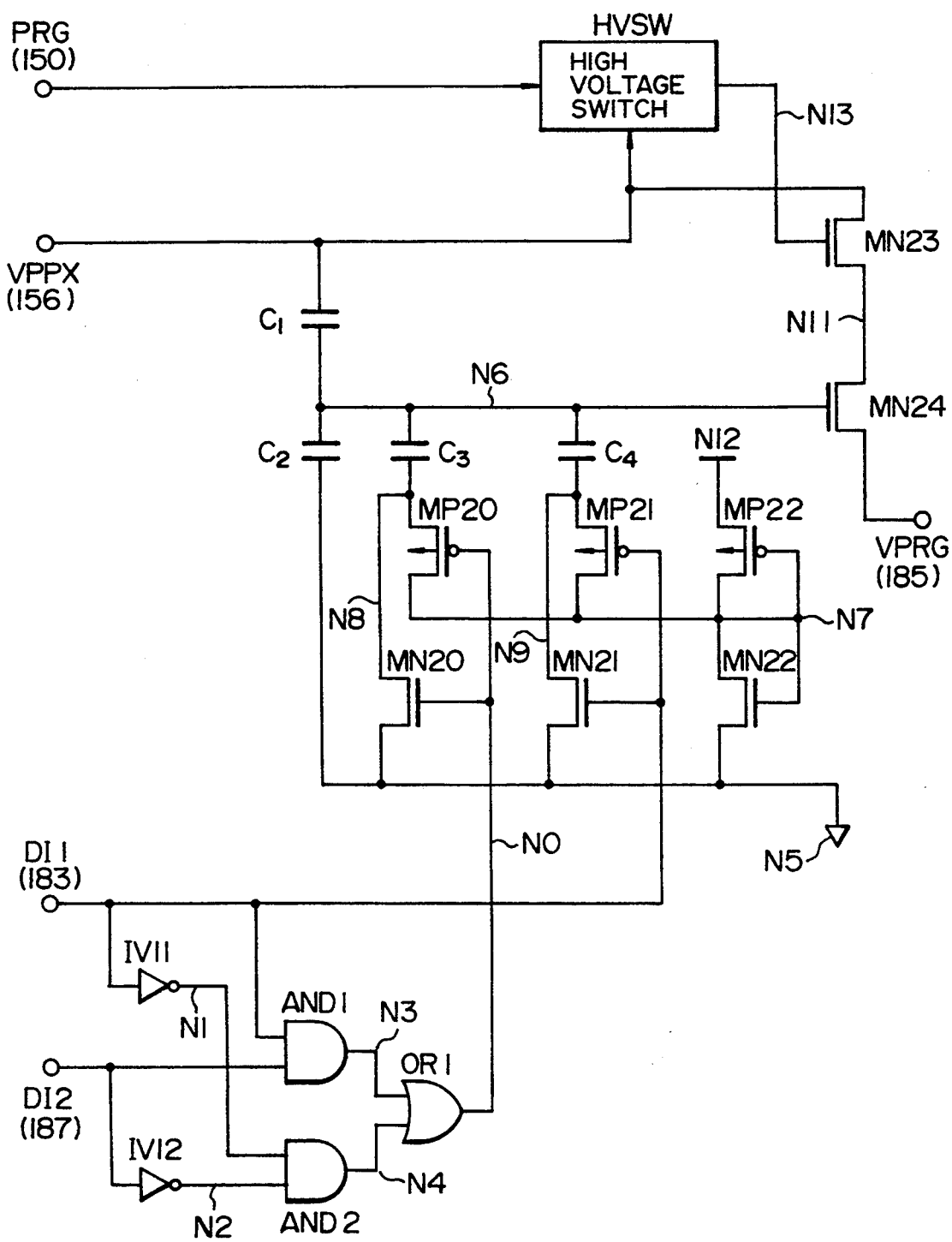
FIG. 2 is a circuit block diagram of the program circuit of the EEPROM of FIG. 1.
Figure 3:
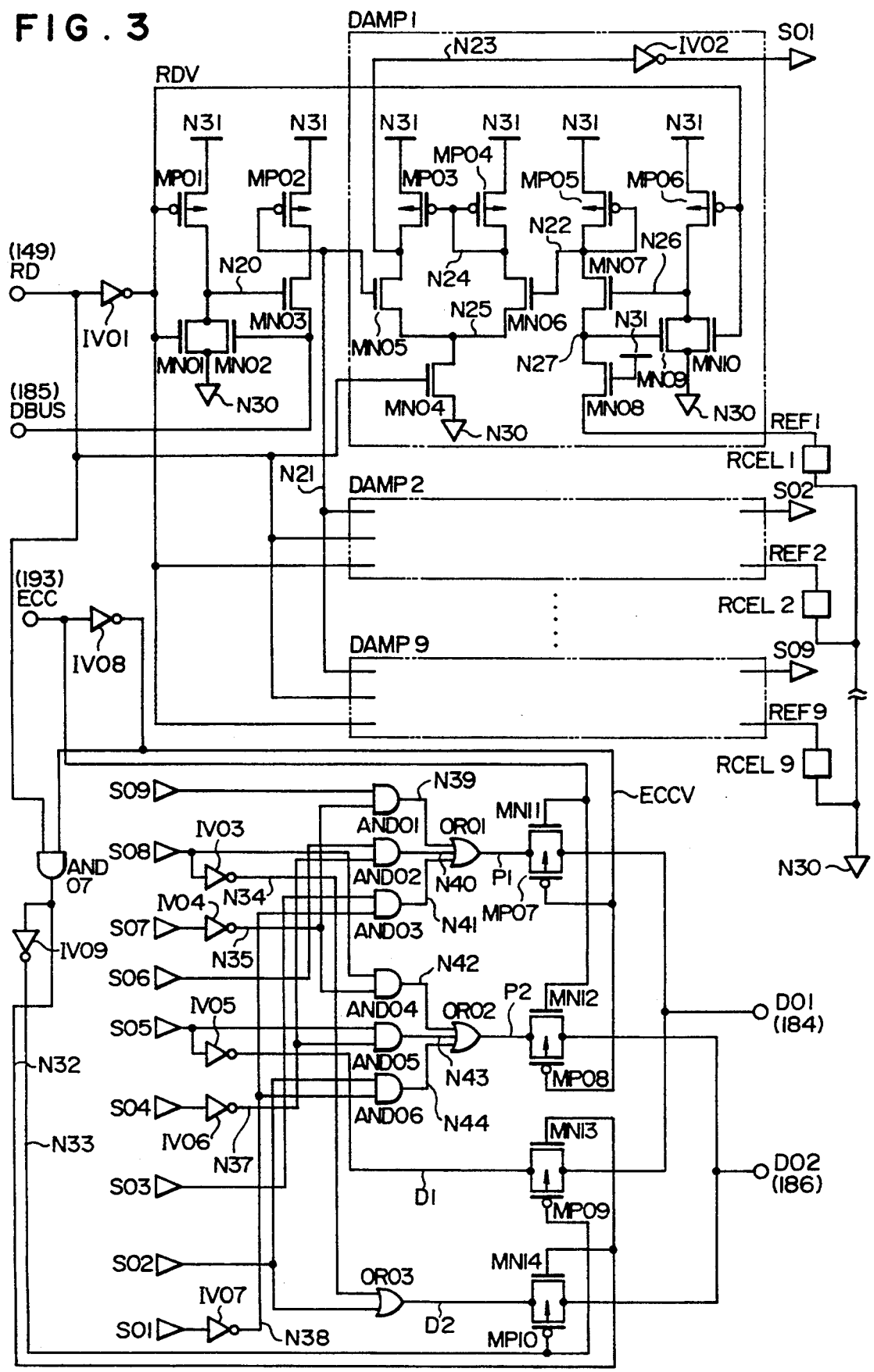
FIG. 3 is a circuit block diagram of the sense circuit of the EEPROM of FIG. 1.
Figure 4:
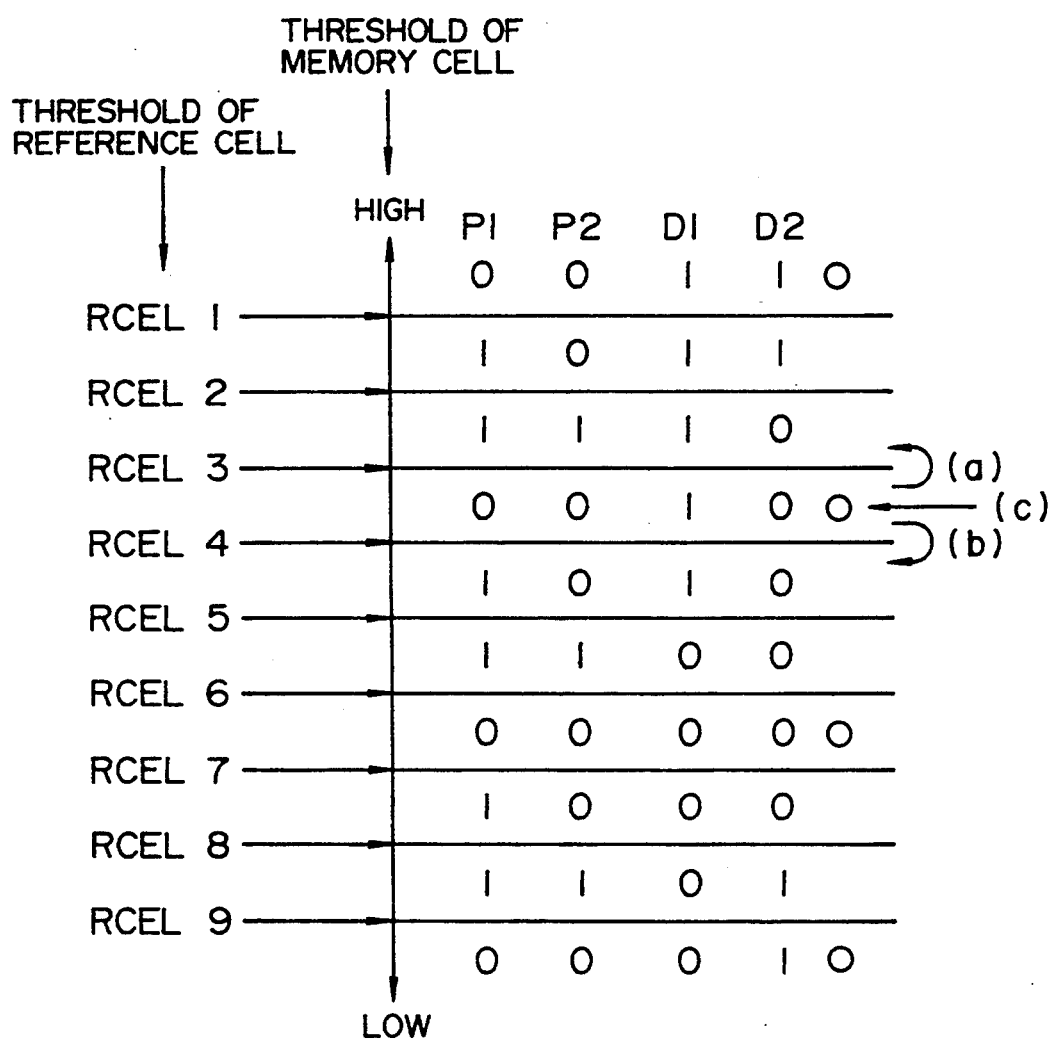
FIG. 4 is a diagram of one example of the relation between the threshold voltage level change of the memory cell and the read data when data is read from the selected memory cell.

One embodiment of the present invention will be described with reference to FIGS. 1 through 4. FIG. 1 shows an EEPROM of one embodiment of the invention, FIG. 2 shows the program circuit in FIG. 1, FIG. 3 shows the sense circuit in FIG. 1 and FIG. 4 is a diagram for explaining how to read data and detect a threshold change according to this invention.

Referring to FIG. 1, there are shown address input terminals 101, 102, 103, 104 and 105, control input terminals 106, 107 and 108, data input/output terminals 109 and 110, address buffers 111, 112, 113, 114 and 115, a chip control circuit 116, a high-voltage generation/control circuit 119, a row decoder 117, a column decoder 118, memory cells 243, 244, ..., 274, memory sense program selection circuits 139, 140, 141 and 142, a multiplexer 126, a program circuit 120, a sense circuit 123, data input buffers 121 and 124 and data output buffers 122 and 125. The memory cell injects electric charges into its floating gate through a thin insulating film as shown, for example, in Document 1 and its configuration is not particularly limited.

The connection among those elements in FIG. 1 is as follows. Shown at 143 is the output from the address buffer 111 and the input to the row decoder 117, 144 is the output from the address buffer 112 and the input to the row decoder 117, 145 is the output from the address buffer 113 and the input to the column decoder 118, 146 is the output from the address buffer 114 and the input to the column decoder 118, 147 is the output from the address buffer 115 and the input to the column decoder 118, and 127, 128, 129 and 130 are row lines (word lines), which are connected to the outputs of the row decoder and to the selection gates of the memory cells and the memory sense program line selection circuits. Reference numerals 175 through 182 are the output from the column decoder 118 and the input to the multiplexer 126, and 131, 132, 133, 134, 135, 136, 137 and 138 are column lines (bit lines), which are connected to the drains of the memory cells and to the multiplexer 126. Numerals 189, 190, 191 and 192 are memory sense program lines which are connected to the memory sense program line selection circuits and the gates of the memory cell transistors. Numeral 148 is a power-down signal which is the output from the chip control circuit 116 and the input to the address buffers 111, 112, 113, 114 and 115, and 149 is a read-enable signal which is the output from the chip control circuit 116 and the input to the sense circuit 123. Numeral 150 is a program-enable signal which is the output from the chip control circuit 116 and the input to the program circuit 120 and high-voltage generation/control circuit 119, and 151 is an erase signal which is the output from the chip control circuit 116 and the input to the high-voltage generation/control circuit 119. Numeral 152 is a data input enable signal which is the output from the chip control circuit 116 and the input to the data input buffers 121 and 124, and 153 is a data output enable signal which is the output from the chip control circuit 116 and the input to the data output buffers 122 and 125. Numeral 193 is a control signal for reading information used for detection of a threshold change of a memory cell which is the output from the chip control circuit 116 and the input to the sense circuit 123, and 185 is a data line which is connected to the output of the program circuit 120, the input of the sense circuit 123 and the input/output of the multiplexer 126. Numeral 183 is connected to the output of the data input buffer 121 and the input of the program circuit 120, 187 is connected to the output of the data input buffer 124 and the input of the program circuit 120, 184 is connected to the output of the sense circuit 123 and the input of the data output buffer 122, and 186 is connected to the output of the sense circuit 123 and the input of the data output buffer 125. Numeral 154 is a high voltage line which is connected to the output of the high-voltage generation/control circuit 119 and the inputs of the row decoder 117 and column decoder 118, and 155 is a memory sense voltage line which is connected to the output of the high-voltage generation/control circuit 119 and the inputs of the memory sense program line selection circuits 139, 140, 141 and 142. Numeral 156 is a program high voltage line which is connected to the output of the high-voltage generation/control circuit 119 and the input of the program circuit 120, and 188 is a memory ground line which is connected to the output of the high-voltage generation/control circuit 119 and the source terminals of the memory cells 243, . . . , 274. Numeral 101 indicates to the input of the address buffer 111, 102 indicates to the input of the address buffer 112, 103 indicates to the input of the address buffer 113, 104 indicates to the input of the address buffer 114, 105 indicates to the input of the address buffer 115, and 106, 107 and 108 are the inputs to the chip control circuit 116. Numeral 109 is the output from the data output buffer 122 which is connected of the input to the data input buffer 121 and 110 is the output from the data output buffer 125 which is connected to the input of the data input buffer 124.

The EEPROM of FIG. 1 is operative in at least a first read mode for reading the written data from a memory cell, a second read mode for reading information used for detection of a threshold voltage change of the memory cell, a write mode, a power-down mode (or standby mode) and an output non-selection mode. The write mode is divided into the erase mode and the program mode.

In the first read mode for reading the written data from a memory cell, the inputs to 106, 107 and 108 are set to the read mode and an address from which the desired data is to be read is inputted to the terminals 101, 102, 103, 104 and 105. The input address is held by the address buffers 111, 112, 113, 114, 115 and the outputs from the address buffers 111, 112 are decoded by the row decoder 117 into the four row lines 127, 128, 129, 130 such that one of the four row lines selected by the input address is at a high voltage and the other three lines are at a low voltage. The output from the address buffer 113, 114, 115 are decoded by the column decoder 118 into eight lines 175 through 182 which cause one of the column lines 131 through 138 selected by the input address to be connected to the data line 185 by the multiplexer 126. One of the memory cells (for example, memory cell 252 at the intersection of lines 128 and 132) is selected by the decoding for the row and column lines. The control signals 148, 149, 150, 151, 152, 153, 193 inactivate the high-voltage generation/control circuit 119, data input buffers 121, 124 and program circuit 120, so that for example, the line 154 is at about the power supply voltage, line 155 is at 3 V, the line 156 is at a low voltage, the line 188 is at ground potential and the lines 183 and 187 are at a low voltage. Since the line 149 is at, for example, a high voltage, the sense circuit 123 is activated to amplify and compare the column voltage appearing on the line 185 for detection and restoration of data. In addition, when the line 193 is at, for example, a low voltage, data of two bits programmed in the memory cell is produced on the lines 184 and 186. The data output buffers 122, 125 buffer the data on lines 184, 186 and produce the stored data of the memory cell on the terminals 109, 110.

In the second read mode for reading the information used for detection of a threshold voltage change of a memory cell, the inputs to 106, 107 and 108 are first set to the read mode for reading the information used for detection of a threshold voltage change and an address from which data is to be read is fed to the input terminals 101, 102, 103, 104, 105. The input address is held by the address buffers 111, 112, 113, 114, 115. The outputs from the address buffers 111, 112 are decoded by the row decoder 117 into four row lines 127, 128, 129, 130 such that one of the four lines is at a high voltage and the other three lines are at a low voltage. The outputs from the address buffers 113, 114, 115 are decoded by the column decoder 118 into eight lines 175 through 182 which causes one of the column lines 131 through 138 to be connected to the data line 185 through the multiplexer 126. One of the memory cells (for example, memory cell 252 at the intersection of 128 and 132) is selected by the decoding for the row and column lines. The control signals 148, 149, 150, 151, 152, 153, 193 inactivate the high-voltage generation/control circuit 119, data input buffers 121, 124 and the program circuit 120 so that, for example, the line 154 is at about the power supply voltage, the line 155 is at, for example, 3 V, the line 156 is at, for example, a low voltage, the line 188 is at ground potential and the lines 183 and 187 are at a low voltage. The sense circuit 123 is activated by the line 149 which is at, for example, a high voltage, thereby to amplify and compare the column line voltage appearing on the line 185 for detection and restoration of data. In addition, when the line 193 is at, for example, a high voltage, information used for detecting the change of the threshold voltage of the memory cell is produced on the lines 184, 186. The data output buffers 122, 125 hold data on the lines 184, 186 and produce at the terminals 109, 110 the information used for detecting the change of the threshold voltage of the memory cell.

In the erase mode, the erase mode is established by the inputs to 106, 107, 108, and the row address to be erased is supplied to the address input terminals 101, 102. The chip control circuit 116 produces, for example, a low voltage on the line 148, a low voltage on the line 149, a low voltage on the line 150, a high voltage on the line 151, a low voltage on the line 152 and a low voltage on the line 153 so that the high voltage generation/control circuit 119 is activated, and the program circuit 120, sense circuit 123 and data output buffers 122, 125 are inactivated. The output 154 from the high-voltage generation/control circuit 119 is a high voltage (for example, 20 V), the output 155 is a high voltage (for example, 20 V), the output 156 is a low voltage or around the power supply voltage and the output 188 is at the ground potential. As a result, one (for example, 128) of the outputs 127, 128, 129, 130 of the row decoder 117 is at a high voltage (for example, 20 V) and one (for example, 190) of the lines 189, 190, 191, 192 is at a high voltage (for example, 20 V). Therefore, the gates of the memory cell transistors of the selected row line, each having the floating gate, are at 20 V, the sources are at ground potential and the drains are at ground potential (since the memory cell transistors are mode conductive by the gate voltage). Fowler-Nordheim tunnel phenomenon occurs in each memory cell so that the threshold voltage becomes as high as, for example, 5 V.

In the program mode, the program mode is first established by the inputs to 106, 107, 108, and then the address for program is supplied to the input terminals 101, 102, 103, 104, 105. The chip control circuit 116 produces, for example, a low voltage on the line 148, a high voltage on the line 150, a low voltage on the line 151, a low voltage on the line 152 and a low voltage on the line 153 so that the high voltage generation/control circuit 119, data input buffers 121, 124 and program circuit 120 are activated and the data output buffer 122 and the sense circuit 123 are inactivated. The output 154 of the high-voltage generation/control circuit 119 is at a high voltage (for example, 23 V), the output 155 is at the ground potential, the output 156 is at a high voltage (for example, 23 V), and the output 188 is at a high impedance. As a result, one (for example, 128) of the outputs 127, 128, 129, 130 of the row decoder 117 is a high voltage (for example, 23 V), and one of the outputs 175 through 182 of the column decoder 118 is a high voltage (for example, 23 V). Thus, the multiplexer is made conductive at its selected part, thereby connecting the column line to the line 185.

In the program mode, the input data is supplied through the input/output terminals 109, 110 substantially at the same time as the address, held by the data input buffer 121, 124 and fed to the program circuit 120. In the program circuit 120, the input data is converted into a program voltage so that the program voltage corresponding to the input data is produced on the line 185. In this embodiment, the program voltage is a selected one of four different voltage values (for example, 22 V, 20 V, 18 V, 16 V). The program voltage value may be one of more than four. If the row line 128 and column line 132 are selected, the signal on the column line 132 is made to the program voltage (for example, 20 V) through the multiplexer 126. Since the line 155 is at ground potential and the line 128 is at 23 V, the line 190 is grounded through the circuit 140. Thus, a voltage of 20 V is applied to the drain of the memory cell 152, and the ground potential is applied to the gate, so that contrary to the erase mode, the threshold value of the memory cell is made as low as, for example, −0.5 V. The threshold value of the memory cell is changed in proportion to the program voltage value as shown in Document 2.

While in this embodiment only the inputs to the control input terminals 106, 107, 108 are used to establish the erase mode, program mode, and other modes, this invention is not limited to this method. In addition, while memory cells of one row line are selected as a unit in the erase mode, the memory cells of one byte or one block may be selected as a unit.

FIG. 2 is a detailed circuit diagram of the program circuit of FIG. 1.

In FIG. 2, there are shown a first data input DI1, a second data input DI2, a high voltage input VPPX, a program enable signal input PRG, and a program voltage output VPRG. There are also shown inverter circuits IV11, IV12, two-input logic product circuits (AND circuits) AND1, AND2 formed of MOS transistors and a two-input logic sum circuit (OR circuit) OR1 formed of a MOS transistor, a high voltage switch HVSW, capacitances C1, C2, C3, C4, N-channel enhancement MOS transistors MN20, MN21, MN22, MN23, MN24 and P-channel enhancement MOS transistors MP20, MP21, MP22. The input DI1 is connected to the inverter IV11 and to logic product circuit AND1. This input is also connected to the gates of the transistors MP21 and MN21. The input DI2 is connected to the inverter IV12 and to the logic product circuit AND1. The output, N1 of the inverter IV11 is connected to the input of the AND2. The output, N2 of the inverter IV12 is connected to the input of the AND2, the output, N3 of the AND1 is connected to the input of the OR1 and the output, N4 of the AND2 is connected to the input of the OR1. The output, N0 of the OR1 is connected to the gates of transistors MP20 and MN20. The ground node, N5 is connected to the ground potential point of the inverter circuits, AND circuits and OR circuit, one end of the capacitance C2 and the sources of the transistors MN20, MN21, MN22. A line N7 is connected to the drains of the transistors MP22, MP21, MP20, MN22 and to the gates of the transistors MP22 and MN22. A line N8 is connected to one end of the capacitance C3, the source of the transistor MP20, and the drain of the transistor MN20. A line N9 is connected to one end of the capacitance C4, the source of the transistor MP21 and the drain of the transistor MN21. A line N6 is connected to one end of the capacitance C1, the other end of the capacitance C2, the other end of the capacitance C3, the other end of the capacitance C4 and the gate of the transistor MN24. A line N11 is connected to the source of the transistor MN23 and the drain of the transistor MN24. The power supply node N12 is connected to the source of the transistor MP22 and the power supply for the inverter circuits, AND circuits and OR circuit. The output, N13 of the high voltage switch HVSW is connected to the gate of the transistor MN23. The high voltage input VPPX is connected to the other end of the capacitance C1, the drain of the transistor MN23 and the input of the high voltage switch HVSW. The program enable signal PRG is supplied to the control input of the high voltage switch HVSW.

In FIG. 2, the first data input DI1 corresponds to the input 183 FIG. 1. Similarly, the second data input DI2 corresponds to the input 187 in FIG. 1, the high voltage input VPPX to the input 156, the program enable signal PRG to the signal 150 in FIG. 1 and VPRG to the output 185 in FIG. 1.

The program circuit shown in FIG. 2 is the circuit for converting two-bit digital data into analog data. When a high voltage (for example, 24 V) is applied to the high voltage input VPPX and the program enable signal PRG becomes a high voltage, the voltage value on the line N6 is determined by the capacitances C1, C2, C3, C4 and the voltage on the line N7 as follows.

The voltage on the line N6 = (voltage of VPPX·value of C1 + value of C3·voltage of N8 + value of C4·voltage of N9)/CT where CT = C1 + C2 + C3 + C4

In FIG. 2, when the voltages on the lines N8 and N9 are selectively switched between the ground potential and the voltage on the line N7 (for example, a constant voltage of about 3 V) in accordance with the input data value, the voltage value on the line N6 can be changed by the value of DI1, DI2. In addition, if the capacitances C3 and C4 are selected to have different values (for example, the value of C4 is twice as large as that of C3), data can be weighted and the voltage on the line N6 can be changed to four different values in proportion to the input data. When the voltage of the program enable signal PRG is high, the output N13 of the high voltage switch HVSW becomes a high voltage. The transistor MN23 is turned on, and the program voltage VPRG equals to the voltage of N6 minus the threshold value of transistor MN24. If the voltage of N6 is 21 V, the program voltage VPRG becomes, for example, 20 V. In the embodiment of FIG. 2, when the first and second data inputs DI1 and DI2 are both a high voltage, the program voltage VPRG becomes the lowest (for example, 16 V). When the first and second data inputs DI1 and DI2 are a low voltage and a high voltage, respectively, the program voltage VPRG is the highest (for example, 22 V). In addition, when the program enable signal PRG is a low voltage, the voltage of N13 is also a low voltage, so that the transistor MN23 is turned off and that the program voltage VPRG is in the floating state.

FIG. 3 is a detailed circuit diagram of the sense circuit in FIG. 1.

In FIG. 3, there are shown a read enable signal RD, a read signal ECC for information to be used in detecting the change of the threshold voltage of the memory cell, or the second read mode signal, a first data output DO1, a second data output DO2 and a memory read data input DBUS. There are shown inverter circuits IV01, IV02, ..., IV09 which are formed of MOS transistors, two-input logic product circuits (AND circuits) AND01, AND02, ..., AND07 which are formed of MOS transistors and two-input logic sum circuits (OR circuits) OR1, OR2, OR3 which are formed of MOS transistors. There are also shown P-channel enhancement MOS transistors MP01, MP02, ..., MP10, N-channel enhancement MOS transistors MN01, MN02, ..., MN14 and reference memory cells RCEL1, RCEL2, ..., RCEL9.

In FIG. 3, a line N20 is connected to the drains of the transistors MP01, MN01, MN02 and the gate of transistor MN03. A line N21 is connected to the drain and gate of the transistor MP02, the drain of transistor MN03 and the gate of transistor MN05 of DAMP1, DAMP2, ..., DAMP9. A line N23 is connected to the drain of transistor MP03, the drain of transistor MN05 and the input of inverter circuit IV02. A line N22 is connected to the drain and gate of transistor MP05, the drain of transistor MN07 and the gate of transistor MN06. A line N24 is connected to the drain of transistor MP04, the drain of transistor MN06, the gate of transistor MP03 and the gate of transistor MN04. A line N25 is connected to the source of transistor MN05, the source of transistor MN06 and the drain of transistor MN04. A line N26 is connected to the drain of transistor MP06, the drain of transistor MN09, the drain of transistor MN10 and the gate of transistor MN07. A line N27 is connected to the source of transistor MN07, the drain of transistor MN08 and the gate of transistor MN09. The circuit block DAMP1 includes the transistors MP03, MP04, MP05, MP06, MN05, MN06, MN04, MN07, MN08, MN09, MN10 and the inverter IV02. The circuit blocks DAMP2, DAMP3, ..., DAMP9 each have the same transistors and wiring patterns as DAMP1.

In FIG. 3, the read signal RD is supplied to the input of the inverter circuit IV01, the input of the AND07 and the gate of the transistor MN04 in each of DAMP1, DAMP2, ..., DAMP9. The output RDV of the inverter circuit IV01 is connected to the gate of the transistor MP01, the gate of transistor MN01 and the gates of transistors MN06 and MN10 in each of DAMP1, DAMP2, ..., DAMP9. The memory read data input DBUS is connected to the gate of transistor MN02 and the source of transistor MN03. The ECC is connected to the input of IV08, the gate of transistor MN11 and the gate of transistor MN12. The output ECCV of the inverter IV08 is connected to the input of the AND07, the gate of transistor MP07 and the gate of transistor MP08. The output N32 of AND07 is connected to the input of the inverter IV09, the gate of transistor MN13 and the gate of transistor MN14. The output N33 of the inverter IV09 is connected to the gate of transistor MP09 and the gate of transistor MP10. The first data output DO1 is connected to the drains of the transistors MN11, MP07, MN13, MP09. The second data output DO2 is connected to the drains of the transistors MN12, MP08, MN14, MP10. SO1 is the output of the inverter circuit IV02 of DAMP1, which is connected to the input of the inverter circuit IV07. SO2 is the output of the inverter IV02 of DAMP2 which is connected to the inputs of the AND06 and OR03. SO3 is the output of the inverter IV02 of DAMP3 which is connected to the input of the AND03. SO4 is the output of the inverter IV02 of DAMP4 which is connected to the input of the inverter IV06. SO5 is the output of the inverter IV02 of DAMP5 and is connected to the input of the inverter IV05 and AND05. SO6 is the output of the inverter IV02 of DAMP6 and is connected to the input of the AND02. SO7 is the output of the inverter IV02 of DAMP7 and is connected to the input of the inverter IV04. SO8 is the output of the inverter IV02 of DAMP8 and connected to the inputs of the inverter IV03 and AND04. SO9 is the output of the inverter IV02 of DAMP9 and connected to the input of the AND01. N34 is the output of inverter IV03 and connected to the input of the OR03, N35 is the output of the inverter IV04 and connected to the inputs of the AND01 and AND04 and D1 is the output of the inverter IV05 and is connected to the sources of transistors MN13 and MP09. N37 is the output of the inverter IV06 and is connected to the inputs of the AND02 and AND05 and N38 is the output of the inverter IV07 and connected to the inputs of the AND03 and AND06. N39, N40 and N41 are the outputs of AND01, AND02 and AND03, respectively and connected to the inputs of the OR01. N42, N43 and N44 are the outputs of AND04, AND05 and AND06, respectively and connected to the inputs of OR02. P1 is the output of OR01 and connected to the sources of transistors MN11 and MP07. P2 is the output of OR02 and connected to the source of transistor MN12 and the source of transistor MP08. D2 is the output of OR03 and connected to the source of transistor MN14 and the source of transistor MP10. A line REF1 is connected to the source of transistor MN08 of DAMP1 and the drain of reference memory cell RCELL1. Lines REF2, REF3, ..., REF9 are respectively connected to the sources of transistors MN08 of DAMP2, DAMP3, ..., DAMP9 and the drains of reference memory cells RCEL2 through RCEL9. A ground node N30 is connected to the ground nodes of the inverter circuits, AND circuits and OR circuits, the source terminals of transistors MN01, MN02, MN04, MN09, MN10 and the sources of reference memory cells RCEL1, RCEL2, ..., RCEL9. A power supply node N31 is connected to the power supply nodes of the inverter circuits, AND circuits and OR circuits, the sources of transistors MP01, MP02, MP03, MP04, MP05, MP06 and the gate of transistor MN08.

The read signal RD in FIG. 3 corresponds to the output 149 in FIG. 1. Similarly, the memory read data input DBUS corresponds to the output 185, ECC to 193 in FIG. 1, DO1 to 184 in FIG. 1 and D02 to 186 in FIG. 1.

In the first read mode in which the data written in the memory cell is read or the second read mode in which the information used for detecting the change of the threshold voltage of the memory cell is read, the read signal RD is rendered to a high voltage and the memory read data input DBUS is at the same potential as the column line of the selected memory cell. Since the output RDV is at a low voltage, the transistor MP01 is turned on and the transistor MN01 is turned off so that the voltage of N20 is increased above 0 V. When the voltage of N20 is increased, the transistor MN03 is turned on and the memory read data input DBUS becomes equal to the voltage of N20 minus the threshold of transistor MN03. However, when the voltage of the memory read data input DBUS becomes higher than the threshold of transistor MN02, the transistor MN02 is turned on thereby suppressing the potential of DBUS from increasing. Thus, when the read signal RD is a high voltage, the memory read data input DBUS becomes an intermediate value (for example, 2 V) between 0 V and the power supply voltage. At this time, if the memory cell to be read is in the on-state, a current flows from the memory read data input DBUS to the source of the memory cell, with the result that the potential of DBUS is slightly reduced (for example, 1.8 V). Therefore, since the current supply is made through the transistor MP02, the voltage of N21 is more reduced (for example, from 4.2 V to 3.5 V) than that of the memory read data input DBUS if the transistor MP02 has a proper size. In addition, since the voltage of N21 is naturally proportional to the amount of current flowing from the memory cell, each transistor MP01, MP02, MN02, MN03 amplifies the potential variation of the memory read data input DBUS. The transistors MP03, MP04, MN04, MN05, MN06 constitute a differential amplifier, and N21 and N22 are differential inputs thereof. The circuit of transistors MP05, MP06, MN07, MN09, MN10 is analogous to that of transistors MP01, MP02, MN01, MN02, MN03, and makes the same action on REF1 as DBUS. The transistor MN08 serves to transmit the potential of REF1 to the line N27.

If the threshold voltage of the memory cell to be read is for example 3 V, and if the threshold voltages of reference memory cells RCEL1 through RCEL7 are for example 5.5 V, 4,5 V, 3.5 V, 2.5 V, 1.5 V, 0.5 V, −0.5 V and −1.5 V, −2.5 respectively, the voltages of REF1 through REF9 satisfy a condition of REF9<... <voltage of REF4<voltage of DBUS<voltage of REF3<... <voltage of REF1. In addition, the outputs SO1 through SO3 are a low voltage, and the outputs SO3 through SO9 are a high voltage. In this case, the threshold of the reference memory cell is established beforehand in a test mode or the like and will not be described in detail in this embodiment. As a result, the output DO1 is a high voltage, and the outputs P1, P2 and DO2 are a low voltage. When the RD is a high voltage and ECC is a low voltage, the sense circuit is set to the read mode in which the data written in the memory cell is read. The data of D1 is produced at DO1 and data of D2 is produced at DO2 so that a high voltage and a low voltage appear at DO1 and DO2 respectively. When RD is a high voltage and ECC is a high voltage, the sense circuit is set to the read mode in which the information used for detecting the change of the threshold voltage of the memory cell is read. The data of P1 is produced at DO1 and data of P2 is produced at DO2 so that a low voltage appears at both DO1 and DO2.

FIG. 4 shows, when two-bit information programmed in a memory cell is read out, as four-bit information, from the memory cell, a relation between the threshold voltage of the memory cell as programmed and the four-bit data which is read out from the nodes P1, P2, D1 and D2 in FIG. 3. In FIG. 4, the upper data correspond to the higher threshold and the lower data correspond to the lower threshold. The threshold voltage written in the memory cell as programmed takes four different values as marked by a circle. Between two adjacent threshold voltages marked by the circle, there are provided three different threshold detection levels of reference cells for detecting the threshold voltage, in order to find, when the level of the threshold voltage stored in the memory cell changes to an adjacent level thereof, the original level of the threshold voltage. However, when the threshold voltage level is changed to a level higher than RCEL1 or lower than RCEL9, the data read out of the memory cell is not varied even when the threshold voltage level is changed, and therefore it is unnecessary to provide a threshold detection level of the reference cell higher than RCEL1 or lower than RCEL9.

The change of the threshold voltage of the memory cell and the detection of data error will be described with reference to FIG. 4.

It is assumed that in the program mode a high voltage and a low voltage appear at the input/output terminals 109 and 110, respectively and that the threshold voltage of the selected memory cell is at a value between the threshold voltage of the reference cell RCEL3 and that of the reference cell RCEL4.

When the threshold voltage of the memory cell is still between the values of RCEL3 and RCEL4 (see in FIG. 4 at (c)), the outputs D1 and D2 are a high voltage and a low voltage, respectively as the data read when the data written in the memory cell is read, and the outputs P1 and P2 are both a low voltage as the data, or information read for use in detecting the change of the threshold voltage of the memory cell. When the threshold voltage of the memory cell is decreased from a value when programmed due to, for example, discharge to a value between the threshold voltage of the reference cell RCEL4 and that of RCEL5 (see FIG. 4 at (b)), the outputs D1 and D2 are a high voltage and a low voltage respectively when reading out the data written in the memory cell and the outputs P1 and P2, which are read out as information used for detecting the change of the threshold voltage of the memory cell, are a high voltage and a low voltage respectively. When the threshold voltage of the memory cell is increased from a value when programmed due to, for example, injection of charge to a value between the threshold voltage of reference cell RCEL2 and that of reference cell RCEL3 (see FIG. 4 at (a)), the outputs D1 and D2 are a high voltage and a low voltage respectively when reading out the data written in the memory cell, and the outputs P1 and P2, which are read out as information used for detecting the change of the threshold voltage of the memory cell, are both a high voltage. Similarly, when the threshold voltage written in the memory cell in the program mode is higher than that of RCEL1 or lower than that of RCEL9 or between the threshold voltages of RCEL6 and RCEL7, the data read out out of the memory cell is not changed even if the threshold voltage of the memory cell is shifted to an adjacent level. The data read out as information used for detecting the change of the threshold voltage value of the memory cell are such that when the threshold voltage of the memory cell is increased, the outputs P1 and P2 are both a high voltage, when it is decreased the outputs P1 and P2 are a high voltage and a low voltage, respectively, and when it is not changed, the outputs P1 and P2 are both a low voltage.

Thus, by providing the reference cell with nine threshold voltage levels for reading out two-bit data as written, the data obtained by reading out the data written in a memory cell does not change even if the level of the threshold voltage of the memory cell changes to an adjacent level. Further, by reading out information used for detecting the change of threshold voltage level, it is possible to detect the change of the threshold voltage level before change of the written data.

This invention is not limited to the above embodiment, but can easily take other various modifications without departing from the scope of the invention.

While in the above embodiment the program voltage in the programming mode is generated by the program circuit, the program voltage may be generated by the high-voltage generation/control circuit or other circuits. While in the above embodiment the level of the program voltage is changed in the programming mode, the duration time of the program voltage or the number of times by which the program voltage is applied may be changed provided that the threshold voltage of the memory cell is set to a value corresponding to input/output information. In addition, while in the above embodiment the reference memory cells are included in the sense circuit, they may be included in the memory array without any problem. While in this embodiment four threshold values are provided in the memory cell for convenience of explanation, more values may be provided.

While in this embodiment the function of the EEPROM is simplified for convenience of explanation, other functions may be added to this function in which case the effect of the invention is not lost. For example, the verify mode or the like after program can be added with ease.

While in this embodiment the memory cell includes a transistor having a floating gate and a select transistor, it is not limited to this so long as the threshold value of the memory cell can be changed in a proportional relation (for example, it may be the memory cell shown in Documents 4 and 5). While the method of detecting the change or process of change of data in the memory cell, or the method of detecting the change of threshold voltage in the above embodiment has been explained in a case in which two-bit data is written in a single memory, the invention is effective in a case where one-bit data is written in a single memory cell or data of three or more bits is written in a single memory cell. In other words, the program circuit is not limited to that in this embodiment. However, when it is desired to obtain information indicative of whether the threshold voltage level of a memory cell is increased or decreased when reading out N-bit data written in the memory cell, it is necessary to provide 2-bit information for detecting the change of the threshold voltage level and to provide $3 \cdot (2N-1)$ detection levels by the reference cells. When it is known that the threshold voltage of the memory cell is increased or decreased, it is necessary to provide one-bit information for detecting the change of the threshold voltage level and to provide $2 \cdot (2N-1)$ detection levels by the reference cells.

Figure 5:
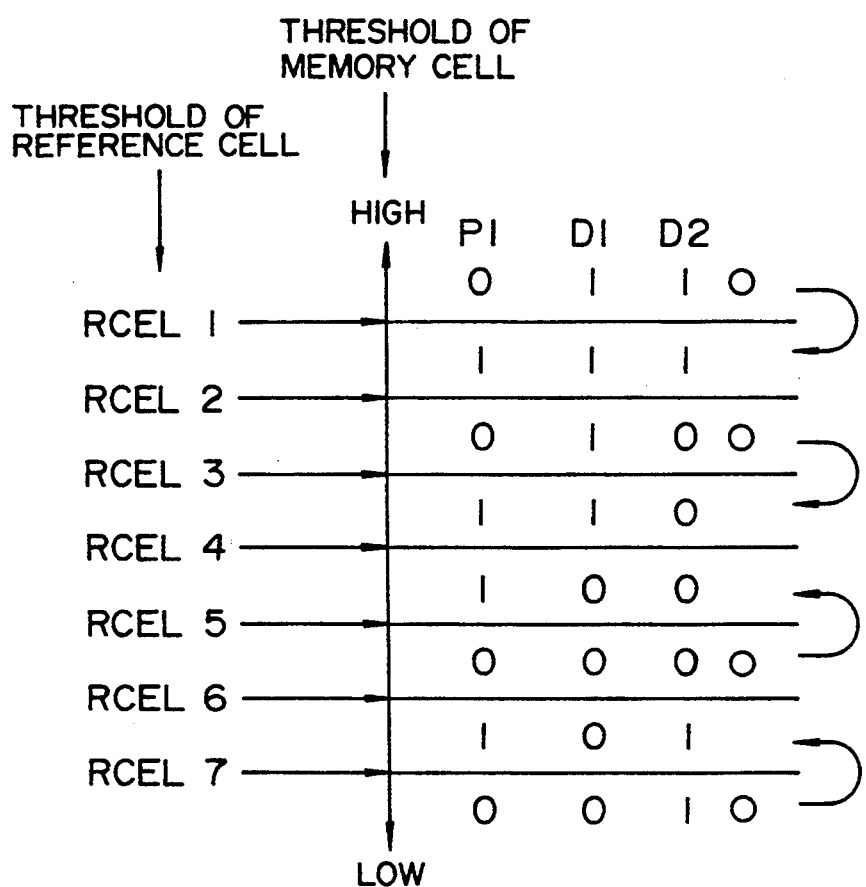
FIG. 5 is a diagram of another example of the relation between the threshold voltage level change of the memory cell and the read data when data is read from the selected memory cell.

FIG. 5 shows one example of the relation between the threshold voltage value of the memory cell, read data (D1, D2) and information (P1) used for detecting the change of the threshold voltage value, in a case such that when two-bit data is written in a memory cell, two higher ones of the threshold voltages as programmed are only decreased while the two lower ones thereof are only increased. When the two-bit data written in the memory cell is read, it is possible to detect the change of the threshold voltage before the change of the data D1 and D2 because seven different threshold detection levels are provided by reference cells so that when the threshold voltage of the memory cell is changed to an adjacent level the programmed value, the data D1 and D2 are not changed but P1 is shifted from 0 to 1.

A second embodiment of this invention will be described with reference to FIG. 6. In the second embodiment, the memory cell of which the threshold voltage is abnormally changed is replaced by a relief cell, or a spare cell.

Figure 6:
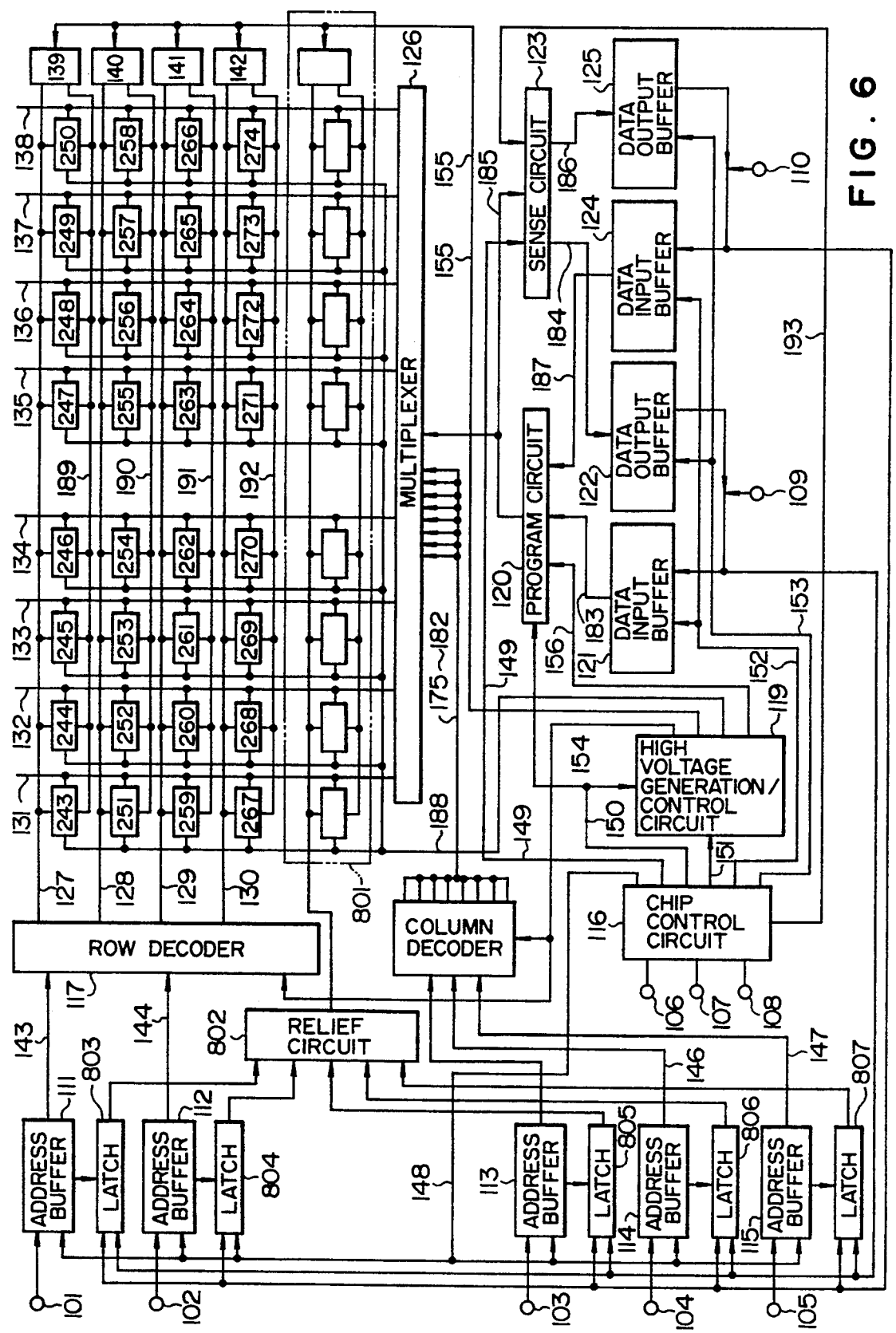
FIG. 6 is a circuit block diagram of an EEPROM of another embodiment of this invention.
Figure 7:
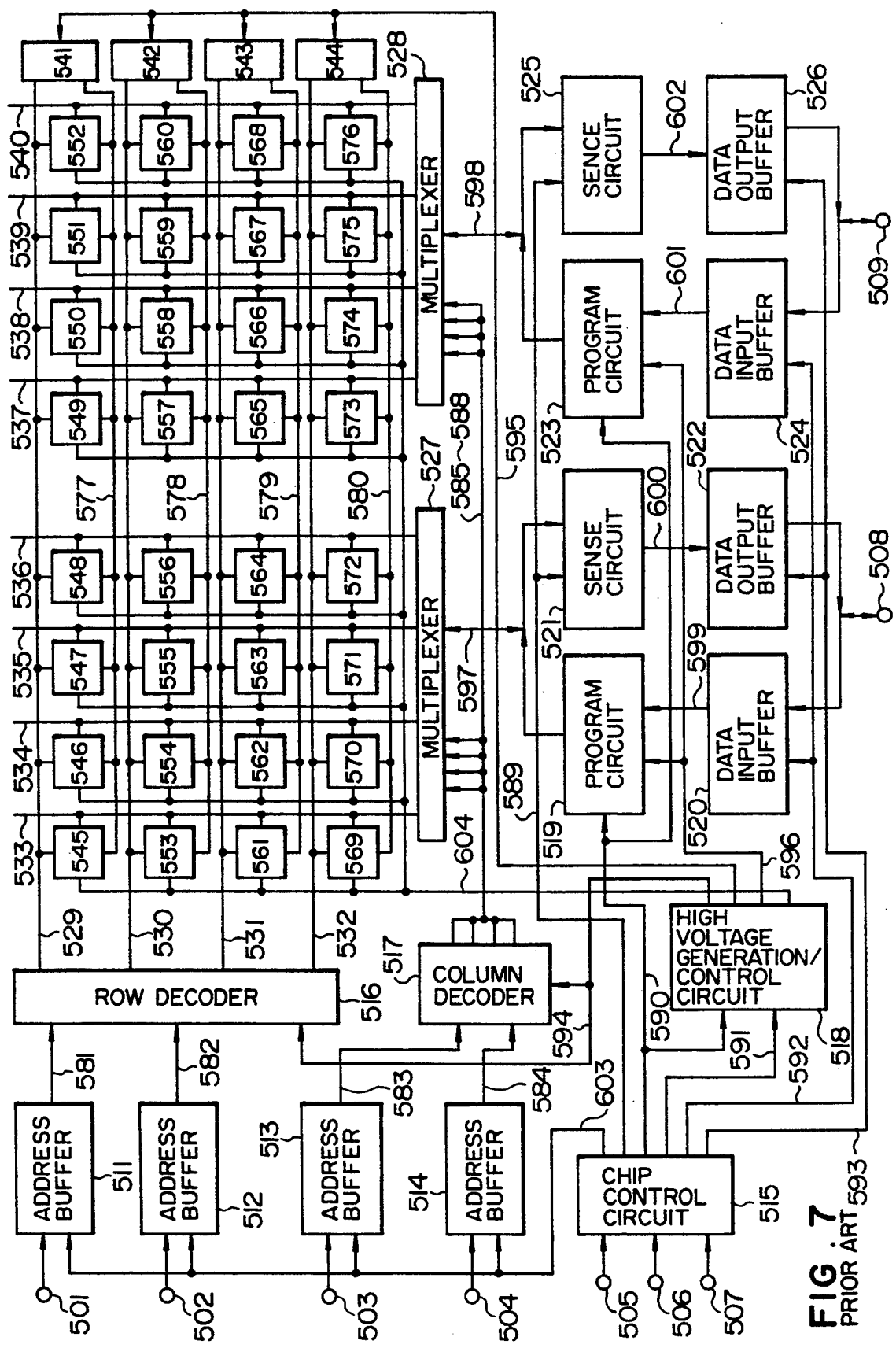
FIG. 7 is a circuit block diagram of a conventional EEPROM.

The non-volatile semiconductor memory device of FIG. 6 has a relief memory cell group 801, a relief circuit 802 for controlling the relief memory cell group 801 to be written in and read from and address latch circuits 803, 804 . . . 807 for storing the address where the reduction of a threshold voltage is detected in addition to the arrangement of the non-volatile semiconductor memory device shown in FIG. 1. The address latch circuits 803, 804 . . . 807 are connected to data output buffers 122, 125. When the sense circuit 123 detects that the threshold voltage of a particular memory cell is reduced, the outputs 184 and 186 from the sense circuit are transmitted through the data output buffers 122, 125 to the address latch circuits 803, 804 . . . 807. The address latch circuits 803, 804 . . . 807, when receiving this signal, latch the address that is stored in the address buffer 111, 112 . . . 115. The relief circuit 802 reads data of the address at which the abnormal threshold is detected and transfers the data to a selected memory cell of the relief cell group (although memory cells of only one line are shown in FIG. 6, relief memory cells are actually provided over a plurality of lines). Then, when the address at which the abnormal threshold has been detected is fed to the address buffer 112 . . . 115, the relief circuit 802 causes data to be written in or read from the relief memory cell corresponding to the address since this address is the same as the address stored in the address latch circuit 803, 804 . . . 807. Therefore, since the rewriting in the relief memory is made before an abnormal change occurs in reading from a memory cell, the total number of times of rewriting is increased, resulting in the increase of reliability. The operation of the other circuits in FIG. 6 is the same as that of the circuits in FIG. 1.

According to this invention, it is possible not only to read the data stored in the memory cells by the comparison with the threshold but also to obtain the information about the voltage of the data stored in the memory cells. In addition, since the method of detecting the threshold change of memory cells in this invention does not need to separately provide memory cells for storing information for use in error detection, the increase of the capacity of the semiconductor memory device and the improvement in the reliability of data can be realized at the same time.

Furthermore, according to the second embodiment of the invention, since the memory cell of which the threshold voltage is reduced is replaced by a relief cell, the life of the whole memory device can be economically extended.

We claim:

1. An electrically programmable non-volatile semiconductor memory device comprising:
   a plurality of memory cells;
   means for selecting at least one of said plurality of memory cells;
   mode setting means for setting one of a first read mode in which data written in said selected memory cell is read and a second read mode in which a change of the threshold voltage level of said selected memory cell is detected;
   first comparing means for comparing a cell voltage signal read from said selected memory cell with at least a predetermined first reference voltage level when said first read mode is set;
   first output means for producing a signal indicative of data written in said selected memory cell on the basis of the comparison in said first comparing means;
   second comparing means for comparing said cell voltage signal with at least a predetermined second reference voltage level different from said first reference voltage level when said second read mode is set; and
   second output means for producing a signal indicative of a change of the threshold voltage of said selected memory cell on the basis of the comparison in said second comparing means.

2. A non-volatile semiconductor memory device according to claim 1, wherein said first comparing means compares said cell voltage signal with a plurality of first different reference voltages, said second comparing means compares said cell voltage signal with a plurality of second different reference voltages and said plurality of first and second reference voltages have such levels that when said reference voltages are arranged in an order of their levels, each of said second reference voltages is positioned between adjacent two of said first reference voltages.

3. A non-volatile semiconductor memory device according to claim 1, wherein said first comparing means compares said cell voltage signal with a plurality of first different reference voltages, said second comparing means compares said cell voltage signal with a plurality of second different reference voltages and said plurality of first and second reference voltages have such levels that when said reference voltages are arranged in an order of their levels, every two of said second reference voltages are located between adjacent two of said first reference voltages.

4. An electrically programmable non-volatile semiconductor memory device comprising:
   a plurality of memory cells;
   means for selecting at least one of said plurality of memory cells;
   mode setting means for setting one of a program mode in which data is written in said selected memory cell, a first read mode in which data written in said selected memory cell is read and a second read mode in which a change of the threshold voltage level of said selected memory cell is detected;
   a program circuit for applying selectively different voltage levels corresponding to at least four different data to said selected memory cell when said program mode is set; and
   a sense circuit for reading the data written in said selected memory cell; said sense circuit comprising:
   first comparing means for comparing a cell voltage signal read from said selected memory cell with at least three different first predetermined reference voltage levels;
   first output means for producing a signal of at least two bits indicative of the data written in said selected memory cell on the basis of the comparison in said first comparing means;
   second comparing means for comparing said cell voltage signal with at least three different second predetermined reference voltage levels different from said first reference voltages when said second read mode is set; and
   second output means for producing a signal indicative of a change of the threshold voltage of said selected memory cell on the basis of the comparison in said second comparing means.

5. A non-volatile semiconductor memory device according to claim 1, further comprising:
   a relief memory cell group including at least one relief memory cell; and
   relief memory cell driving means connected to said second output means and which is responsive to an output from said second output means to replace said selected memory cell by a memory cell selected from said relief memory cell group.

6. A non-volatile semiconductor memory device comprising:
   a plurality of memory cells arranged in a matrix of rows and columns;
   an address buffer for holding an address of one of said plurality of memory cells;

means for selecting the one of said plurality of memory cells in accordance with the address held in said address buffer;

a circuit for comparing a signal read from said selected memory cell with a predetermined first threshold voltage level and producing a digital signal based on a result of the comparison; and means for comparing said signal read from said selected memory cell with a second threshold voltage level different from said first threshold voltage level, in order to detect a change of a threshold voltage set to said selected memory cell, and for producing a relief demand based on a result of the comparison.

7. A non-volatile semiconductor memory device according to claim 6, further comprising:

a relief memory cell group including at least one relief memory cell; and relief memory cell driving means responsive to said relief demand to replace said selected memory cell by one relief memory cell selected from said relief memory cell group.

8. A non-volatile semiconductor memory device comprising:

a plurality of memory cells arranged in a matrix of rows and columns;

an address buffer for holding an address of one of said plurality of memory cells;

means for selecting the one of said plurality of memory cells in accordance with the address held in said address buffer;

a circuit for comparing a signal read from said selected memory cell with a predetermined first threshold voltage level and producing a digital signal based on a result of the comparison;

means for comparing said signal read from said selected memory cell with a second threshold voltage level different from said first threshold voltage level and for producing a relief demand based on a result of the comparison;

a relief memory cell group including at least one relief memory cell;

relief memory cell driving means responsive to said relief demand to replace said selected memory cell by one relief memory cell selected from said relief memory cell group; and address latch means connected to said address buffer and responsive to said relief demand to store the address held in said buffer; and wherein said relief memory cell driving means includes means for driving said selected relief memory cell in place of said selected memory cell when the address stored in said address latch means is inputted to said address buffer.

* * * * *